(12) United States Patent
Yu et al.

(10) Patent No.: US 9,324,713 B1
(45) Date of Patent: Apr. 26, 2016

(54) ELIMINATING FIELD OXIDE LOSS PRIOR TO FINFET SOURCE/DRAIN EPITAXIAL GROWTH

(71) Applicant: GLOBALFOUNDRIES Inc., Grand Cayman (KY)

(72) Inventors: Hong Yu, Rexford, NY (US); Bingwu Liu, Ballston Spa, NY (US); Hui Zang, Albany, NY (US); Lun Zhao, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/658,279

(22) Filed: Mar. 16, 2015

(51) Int. Cl.
| | |
|---|---|
| *H01L 21/8238* | (2006.01) |
| *H01L 27/088* | (2006.01) |
| *H01L 29/66* | (2006.01) |
| *H01L 29/06* | (2006.01) |
| *H01L 21/311* | (2006.01) |
| *H01L 21/3105* | (2006.01) |
| *H01L 21/762* | (2006.01) |
| *H01L 21/8234* | (2006.01) |
| *H01L 29/78* | (2006.01) |

(52) U.S. Cl.
CPC ...... *H01L 27/0886* (2013.01); *H01L 21/31055* (2013.01); *H01L 21/31111* (2013.01); *H01L 21/31116* (2013.01); *H01L 21/762* (2013.01); *H01L 21/823418* (2013.01); *H01L 21/823431* (2013.01); *H01L 21/823481* (2013.01); *H01L 29/0653* (2013.01); *H01L 29/6653* (2013.01); *H01L 29/66545* (2013.01); *H01L 29/66636* (2013.01); *H01L 29/7848* (2013.01)

(58) Field of Classification Search
CPC .............. H01L 21/823821; H01L 21/845; H01L 27/0886; H01L 27/10826; H01L 29/41791; H01L 29/66795
USPC ........... 257/288, 368, 369; 438/151, 197, 199
See application file for complete search history.

(56) References Cited

U.S. PATENT DOCUMENTS

| | | | | |
|---|---|---|---|---|
| 2012/0132989 | A1* | 5/2012 | Haensch | H01L 29/0673 257/347 |
| 2014/0042500 | A1* | 2/2014 | Wann | H01L 29/41791 257/288 |
| 2014/0183605 | A1* | 7/2014 | Mochizuki | H01L 29/785 257/288 |
| 2015/0008483 | A1* | 1/2015 | Ching | H01L 29/7856 257/190 |
| 2015/0035061 | A1* | 2/2015 | Yoon | H01L 29/66545 257/365 |
| 2015/0147860 | A1* | 5/2015 | Kim | H01L 29/66795 438/283 |
| 2015/0357472 | A1* | 12/2015 | Huang | H01L 29/7851 257/20 |

* cited by examiner

Primary Examiner — Jarrett Stark
Assistant Examiner — Shahed Ahmed
(74) Attorney, Agent, or Firm — Ditthavong & Steiner, P.C.

(57) ABSTRACT

Method for forming FinFET source/drain regions with reduced field oxide loss and the resulting devices are disclosed. Embodiments include forming silicon fins separated by a field oxide on a silicon substrate; recessing the field oxide to reveal an upper portion of the silicon fins; forming a spacer layer conformally over the upper portion of the fins and over the field oxide; filling spaces between the fins with a material having high selectivity with the spacer layer; recessing the material; removing the spacer layer above an upper surface of the material; removing the material; recessing the upper portion of the fins; and epitaxially growing source/drain regions on the recessed fins.

13 Claims, 12 Drawing Sheets

BACKGROUND

BACKGROUND

BACKGROUND

BACKGROUND

BACKGROUND

BACKGROUND

BACKGROUND

BACKGROUND

BACKGROUND

BACKGROUND

BACKGROUND

BACKGROUND

BACKGROUND

BACKGROUND

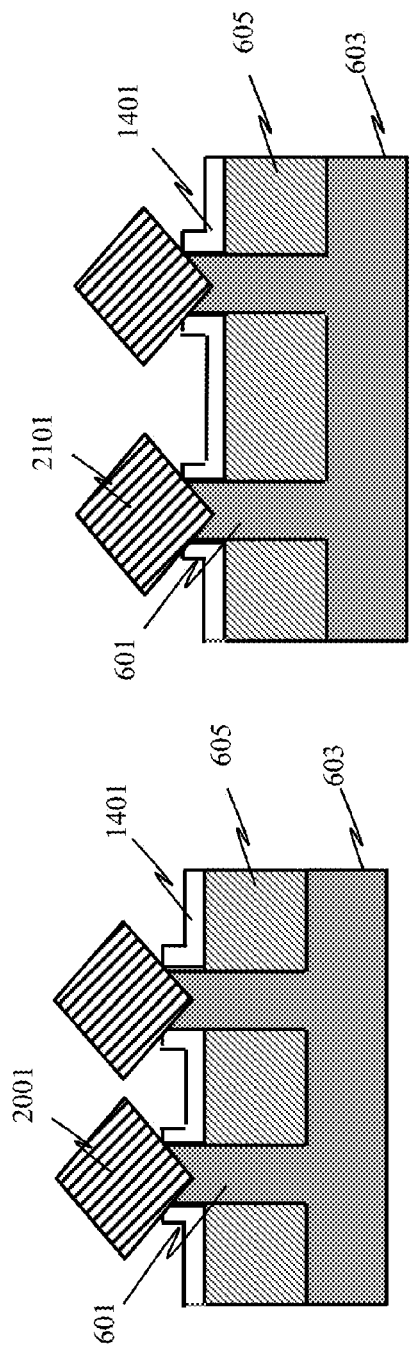
FIG. 21
FIG. 20
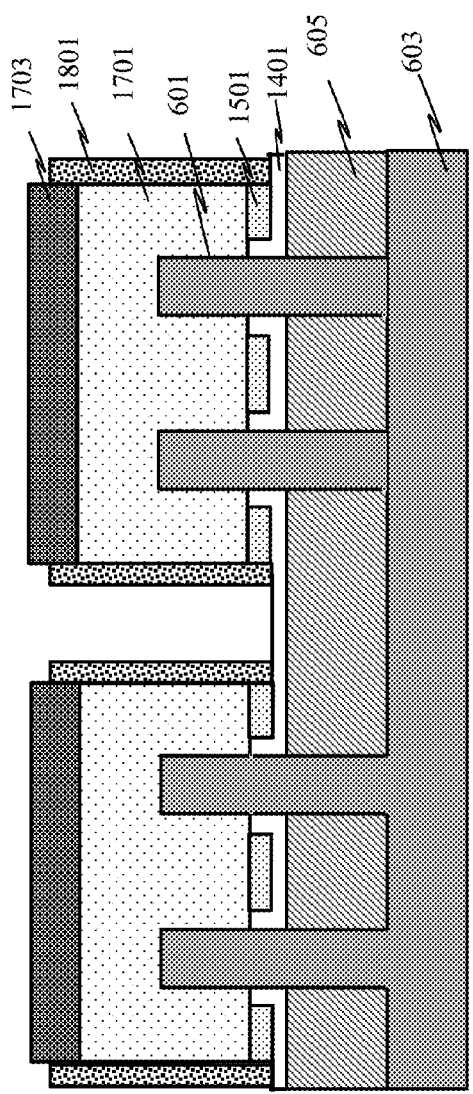
FIG. 22

US 9,324,713 B1

ELIMINATING FIELD OXIDE LOSS PRIOR TO FINFET SOURCE/DRAIN EPITAXIAL GROWTH

TECHNICAL FIELD

The present disclosure relates to formation of fin-type field effect transistors (FinFETs). The present disclosure is particularly applicable to preparing FinFET fins for epitaxially growing source/drain regions.

BACKGROUND

In FinFETs, fins 101 are formed on a silicon substrate 103 with a shallow trench isolation (STI) region, or field oxide 105, between the fins, as illustrated in plan and cross-sectional views in FIGS. 1A and 1B, respectively. FIGS. 2A through 4A schematically illustrate plan views of process steps shown in FIGS. 2B through 4B and 2C through 4C, which illustrate cross-sectional views across the fins and along a dummy gate electrode, respectively. As illustrated in FIG. 2B, the fins 101 are revealed (e.g. to a depth of 30 nm to 60 nm), and in FIG. 2C, the dummy gate electrode 203 with hardmask 205 is formed. Adverting to FIG. 3B, the field oxide 105 may be partially etched away (as shown at 301) during post-gate cut processes such as cleaning steps with diluted hydrogen fluoride (dHF) and reactive ion etching (RIE) to form source/drain cavities, and even further, as shown in FIG. 4B at 401, with the use of SiCoNi material for cleaning the source/drain epitaxial growth interface and forming a recess for the epitaxial growth.

FIGS. 3C and 4C schematically illustrate formation of gate spacers 303 after the gate cut and clean. As illustrated in FIG. 5A, when the source/drain regions 501 are epitaxially grown, they may merge, as shown at 503, for standard fin pitch. Alternatively, for a large fin pitch, as illustrated in FIG. 5B, the oxide loss between the fins may dip down farther. Also, as illustrated in FIG. 5C, there may be a large loss of field oxide between two gate electrodes. The oxide loss may cause severe undercutting under the spacers, which in turn forms a pathway or channel from the dummy gate to the bottom silicon substrate through which, during removal of the dummy gate to form a replacement metal gate (RMG), gate-to-contact shorts may develop. Further, if the oxide loss is too large, the cavity for source/drain epitaxial growth will extend too deep, inducing short channel effects. Additionally, an uneven fin sidewall profile or remaining nitride spacer profile after source/drain RIE causes a non-uniform source/drain epitaxial profile.

A need therefore exists for methodology enabling a uniform epi profile with uniform fin sidewall spacers and with reduced field oxide loss and the resulting device.

SUMMARY

An aspect of the present disclosure is a method of forming source/drain regions on FinFET fins by employing uniform fin sidewall spacers.

Another aspect of the present disclosure is a FinFET device with uniform fin sidewall spacers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming silicon fins separated by a field oxide on a silicon substrate; recessing the field oxide to reveal an upper portion of the silicon fins; forming a spacer layer conformally over the upper portion of the fins and over the field oxide; filling spaces between the fins with a material having high selectivity with the spacer layer; recessing the material; removing the spacer layer above an upper surface of the material; removing the material; recessing the upper portion of the fins; and epitaxially growing source/drain regions on the recessed fins.

Aspects of the present disclosure include the spacer layer including silicon nitride (SiN), silicon carbon nitride (SiCN), silicon oxycarbon nitride (SiOCN), or silicon boron carbon nitride (SiBCN). Other aspects include forming the spacer layer to a thickness of 8 nm to 15 nm. Further aspects include recessing the material down to a thickness of 150 nm to 300 nm. An additional aspect includes the spacer layer including an etch stop layer. Another aspect includes the etch stop layer including SiCN or hafnium oxide ($HfO_2$). Further aspects include forming the etch stop layer to a thickness of 2 nm to 6 nm. Other aspects include forming the spacer layer by forming a self-aligned contact oxide layer followed by an etch stop layer. Additional aspects include filling the spaces with the material by flow controlled vertical deposition (FCVD) or high density plasma (HDP) followed by chemical mechanical polishing (CMP). Another aspect includes recessing the material to a depth of 35 nm to 50 nm. Further aspects include removing the spacer layer above an upper surface of the material by reactive ion etching (RIE) or wet etching. Additional aspects include, prior to removing the material, forming dummy gate electrodes over the fins; forming a hardmask over the dummy electrodes; and forming low-k dielectric spacers on sidewalls of the dummy gate electrodes.

Another aspect of the present disclosure is a device including: a silicon substrate; silicon fins on the silicon substrate; a field oxide between at a lower portion of the silicon fins; epitaxially grown source/drain regions on the silicon fins; and a conformal spacer layer having a horizontal portion over the field oxide and vertical portions at opposite edges of each horizontal portion.

Aspects include the field oxide being coplanar with an upper surface of the silicon fins and the source/drain regions being grown between the vertical portions of the spacer layer. Further aspects include the spacer layer including SiN, SiCN, silicon SiOCN, or SiBCN. Other aspects include the silicon fins extending to an upper surface of the vertical portions of the spacer layer, and the spacer layer including an etch stop layer. Another aspect includes the etch stop layer including SiCN or $HfO_2$. Additional aspects include the silicon fins extending to an upper surface of the vertical portions of the spacer layer, and the spacer layer including a SAC oxide layer and an etch stop layer over the SAC layer. A further aspect includes the vertical portions having a length of 5 nm to 20 nm.

Another aspect of the present disclosure is a method including: forming silicon fins separated by a field oxide on a silicon substrate; recessing the field oxide to reveal an upper portion of the silicon fins; forming a spacer layer of SiN, SiCN, SiOCN, or SiBCN to a thickness of 8 nm to 15 nm or of SiCN or $HfO_2$ to a thickness of 2 nm to 6 nm conformally over the upper portion of the fins and over the field oxide; filling spaces between the fins with an oxide having high selectivity with the spacer layer; recessing the oxide to a thickness of 5 nm to 20 nm; removing the spacer layer above an upper surface of the oxide; removing the oxide; recessing the upper portion of the fins; and epitaxially growing source/drain regions on the recessed fins.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 4A and FIGS. 1B and 2C through 4B and 4C schematically illustrate plan and cross-sectional views, respectively, of a conventional method for preparing FinFET fins for epitaxially growing source/drain regions;

FIGS. 14A and 14B through 19C schematically illustrate a process flow for preparing FinFET fins for forming epitaxially grown FinFET source/drain regions, in accordance with another exemplary embodiment, with FIGS. 17A through 19A illustrating plan views, and FIGS. 17B through 19B and 17C through 19C illustrating cross-sectional views; and FIGS. 20 and 21 schematically illustrate cross-sectional views of epitaxially grown FinFET source/drain regions on fins with standard pitch and large pitch, respectively, and FIG. 22 schematically illustrates a cross-sectional view of tip-to-tip gate electrodes resulting from the process shown in FIGS. 14A and 14B through 19C.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of field oxide loss and the resultant gate-to-contact shorts and non-uniform epitaxial profiles attendant upon gate cut cleaning, source/drain region RIE, and pre-epi cleaning steps etching the field oxide. In accordance with embodiments of the present disclosure, the field oxide is protected by a spacer layer or etch stop layer forming fin spacers.

Methodology in accordance with embodiments of the present disclosure includes forming silicon fins separated by a field oxide on a silicon substrate and recessing the field oxide to reveal an upper portion of the silicon fins. Next a spacer layer is conformally formed over the upper portion of the fins and over the field oxide. Then, spaces between the fins are filled with a material having high selectivity with the spacer layer, and the material is recessed. The spacer layer is then removed above an upper surface of the material followed by removal of the material. The upper portion of the fins is then recessed, and source/drain regions are epitaxially grown on the recessed fins.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 7:
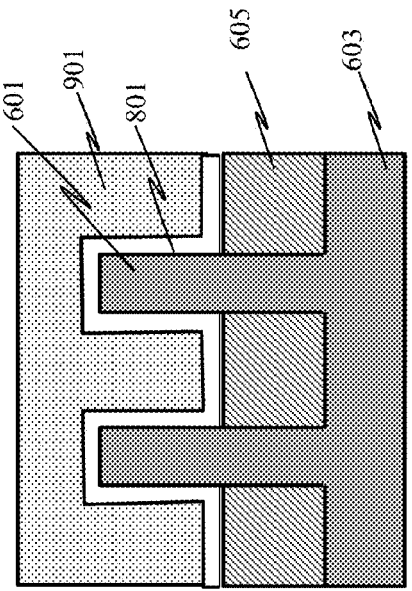

FIGS. 6 through 13 schematically illustrate a process flow for forming epitaxially grown FinFET source/drain regions, in accordance with an exemplary embodiment. Adverting to FIG. 6, FinFET fins 601 are formed in a silicon substrate 603 by a conventional technique. Spaces between the fins are filled with a field oxide 605, such as silicon dioxide. As illustrated in FIG. 7, the field oxide is recessed, for example by etching, to reveal the fins. Fins 601 are exposed to a depth 701 of 30 nm to 60 nm.

Figure 8:
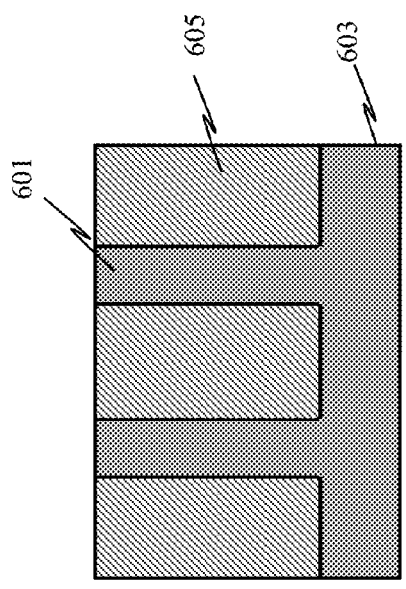

Next, a spacer material 801 is conformally deposited over fins 601 and field oxide 605, as illustrated in FIG. 8. Spacer material 801 may, for example, be SiN, SiCN, SIOCN, or SiBCN, and may be deposited to a thickness of 8 nm to 15 nm.

Figure 9:
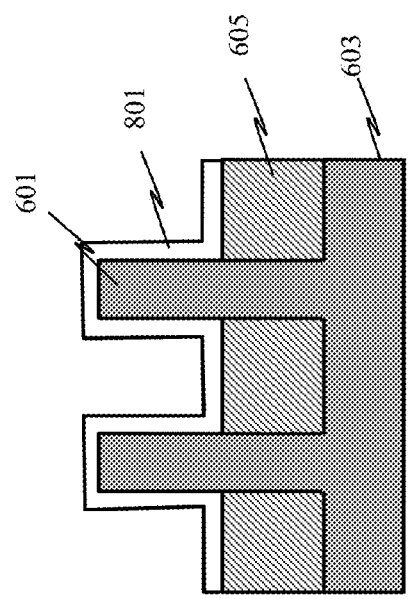

As illustrated in FIG. 9, spaces between the fins are filled with a spin-on-material 901 that has high selectivity with SiN. Spin-on-material 901 may, for example, be silicon dioxide or a spin-on hard mask (SOH), and may also be formed to cover spacer material 801, as shown in FIG. 9.

Figure 10:
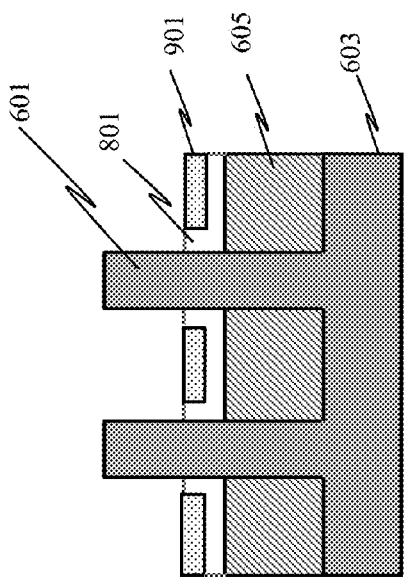
Figure 11:
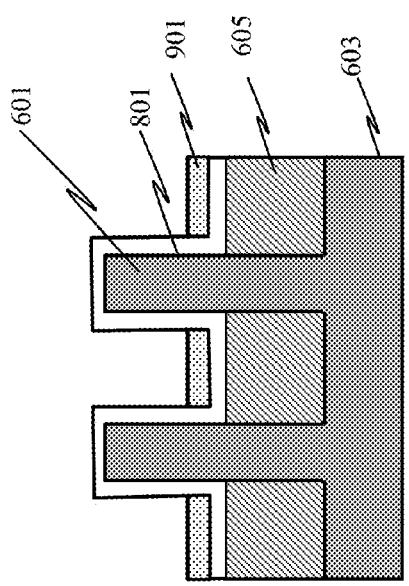

Adverting to FIG. 10, spin-on-material 901 may be recessed to a thickness of 150 nm to 300 nm, e.g. 200 nm. Spacer material 801 is then etched down to the upper surface of spin-on-material 901, as illustrated in FIG. 11.

Figure 1A:
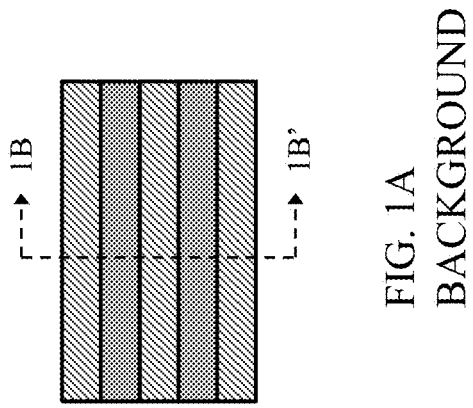
Figure 1B:
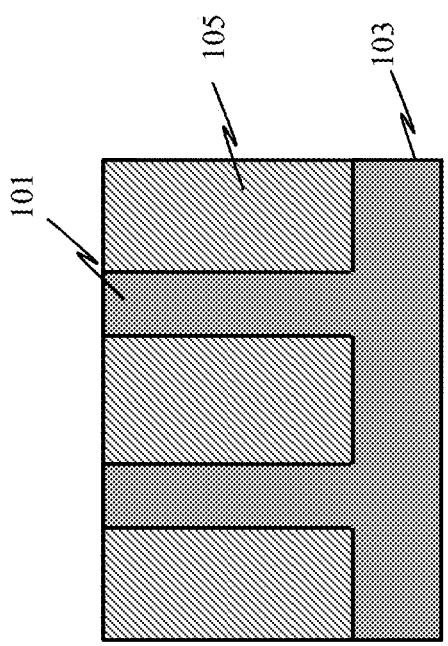
Figure 2A:
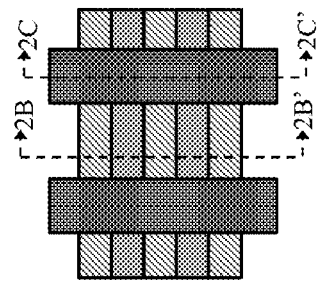
Figure 2B:
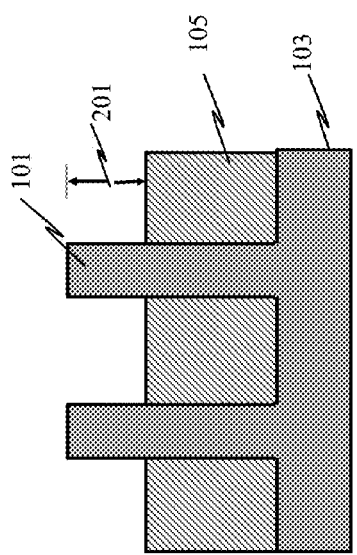
Figure 2C:
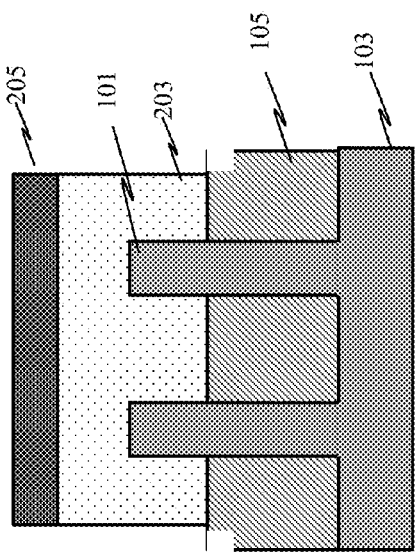
Figure 3A:
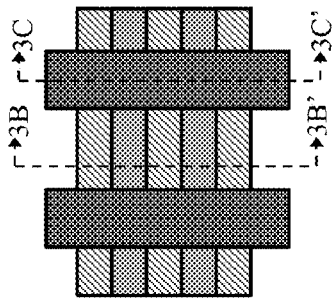
Figure 3B:
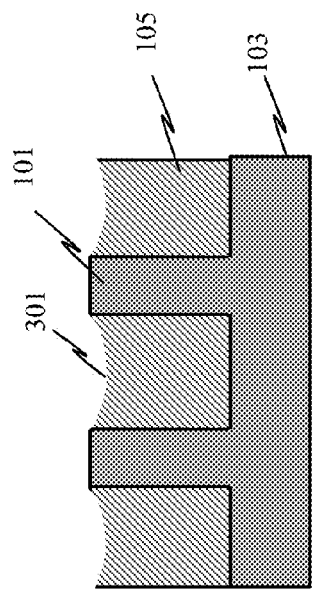
Figure 3C:
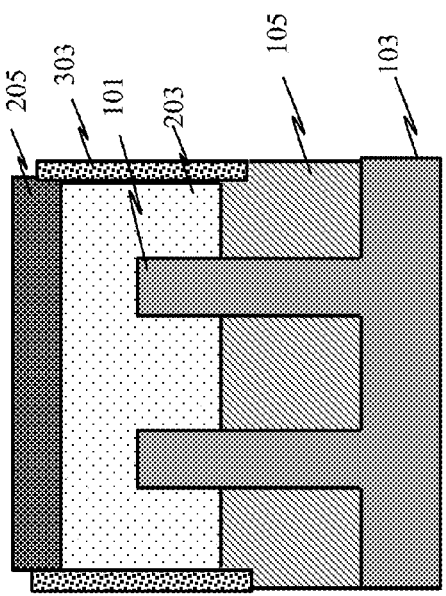
Figure 4A:
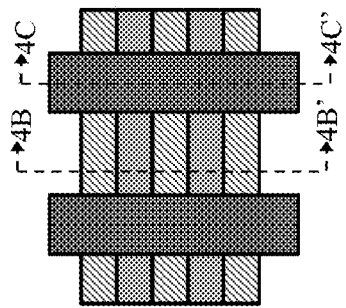
Figure 4B:
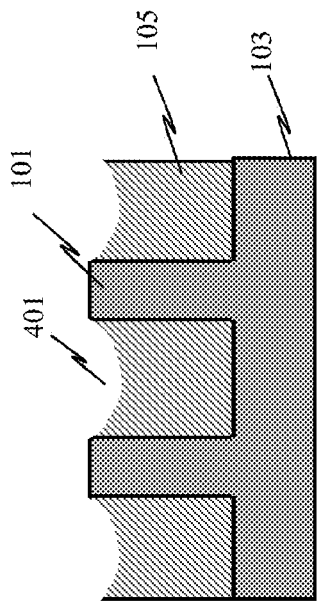
Figure 4C:
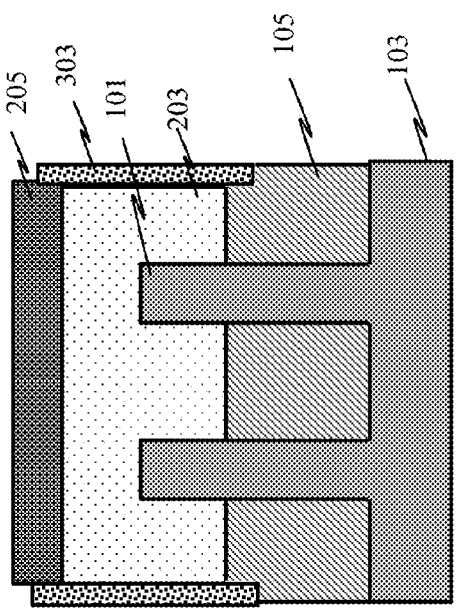
Figure 5A:
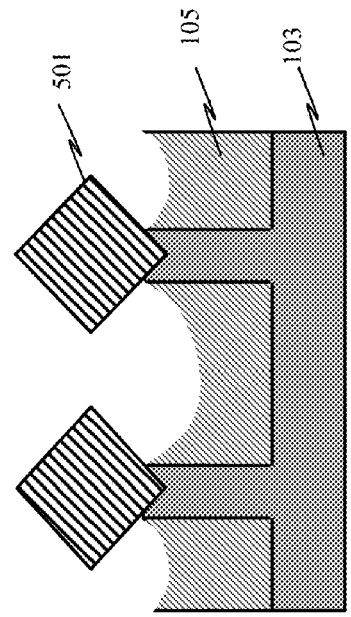
FIGS. 5A and 5B schematically illustrate cross-sectional views of epitaxially grown FinFET source/drain regions on fins with standard pitch and large pitch, respectively, and FIG. 5C schematically illustrates a cross-sectional view of tip-to-tip gate electrodes resulting from the process shown in FIGS. 1A through 5B.
Figure 5B:
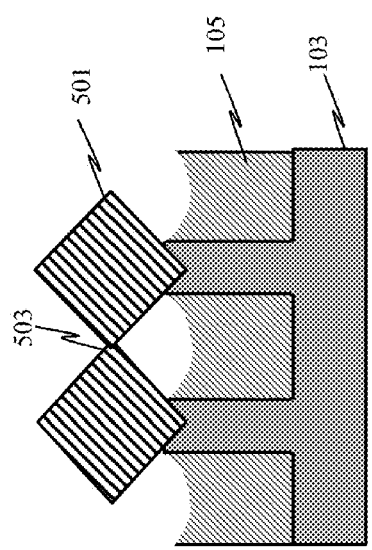
Figure 5C:
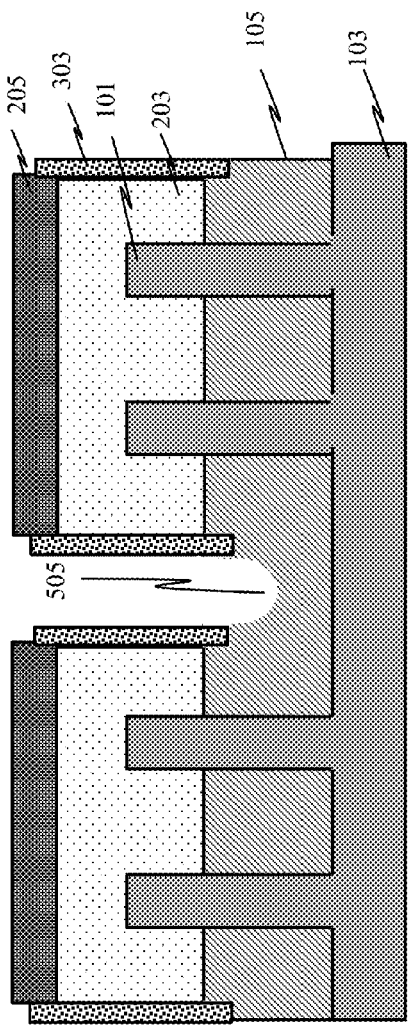
Figure 6:
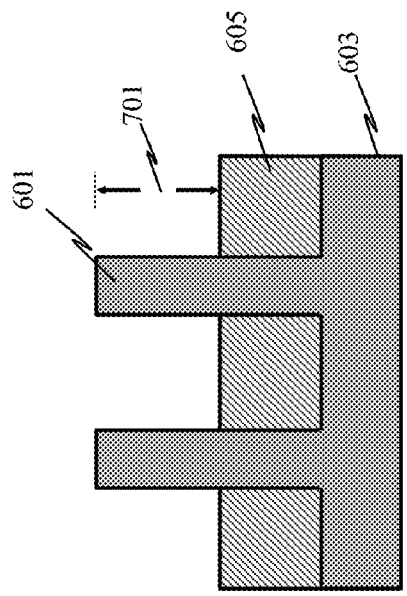
FIGS. 6 through 13 schematically illustrate a process flow for forming epitaxially grown FinFET source/drain regions, in accordance with an exemplary embodiment.
Figure 12:
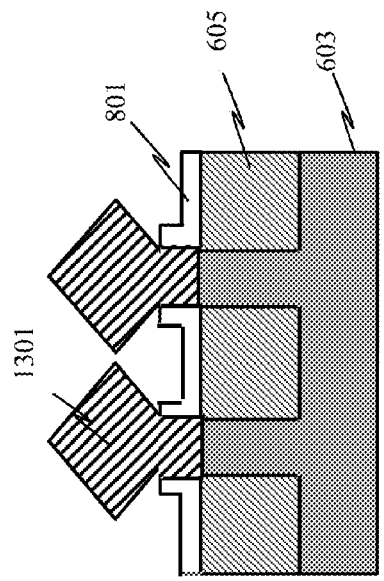
Figure 13:
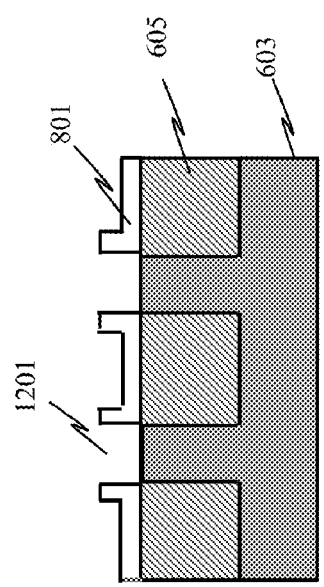

As illustrated in FIG. 12, spin-on-material 901 may be removed. Further, fins 601 may be etched forming cavity 1201 for source/drain epitaxial growth. The bottom surface of cavity 1201 may be substantially coplanar with field oxide 605. Then, source/drain regions 1301 are epitaxially grown on fins 801 in cavities 901, as shown in FIG. 13. Source/drain regions 1301 may be formed of embedded silicon phosphide (eSiP) for NFET source/drain regions or embedded silicon germanium (eSiGe) for PFET source/drain regions. The remaining sidewall spacers help achieve sufficient overfill without resulting in an epi merge (as in FIG. 5A).

Figure 14A:
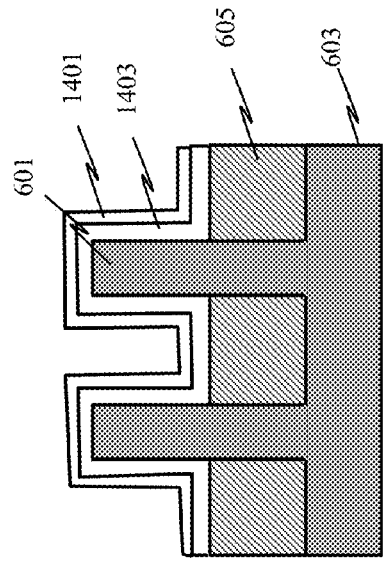
Figure 14B:
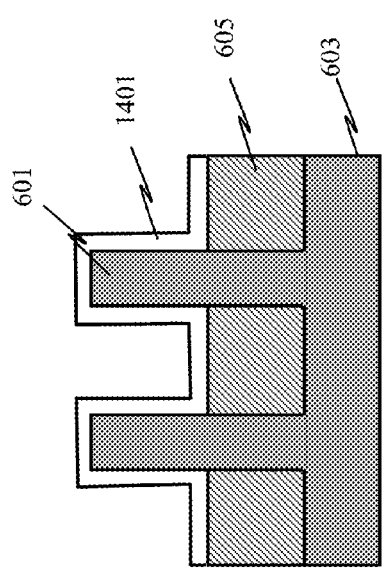

Adverting to FIG. 14A, in accordance with another embodiment, after the fins are revealed, for example to a depth 5 nm to 20 nm deeper than in the conventional process, instead of a spacer material 801, an etch stop layer 1401 may be conformally deposited over the fins 601 and field oxide 605. Etch stop layer 1401 may for example be formed of hafnium oxide (HfO) and to a thickness of 2 nm to 6 nm, e.g. 3 nm. Alternatively, a self-aligned contact (SAC) oxide layer 1403 may be formed to a thickness of 2 nm to 5 nm followed by the etch stop layer 1401, as illustrated in FIG. 14B.

Figure 15:
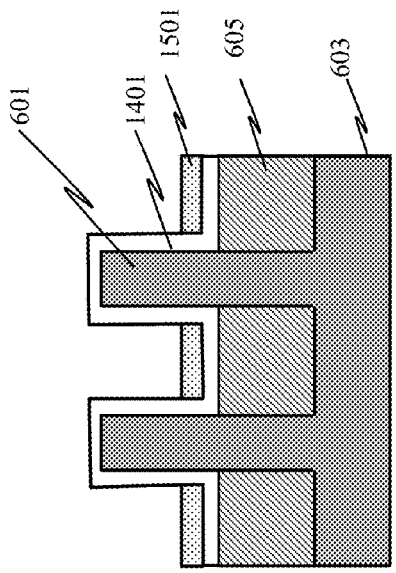
Figure 16:
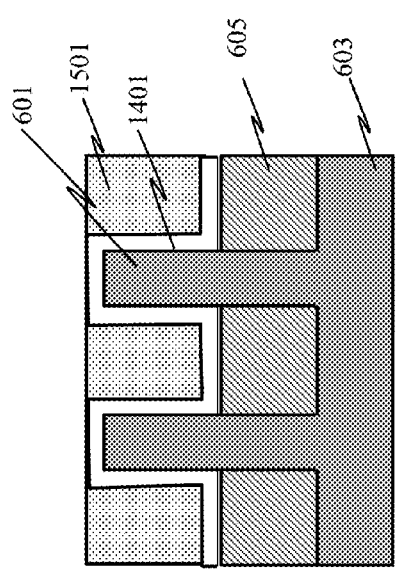

As illustrated in FIG. 15, an oxide 1501 may be formed between and over fins 601, and then polished down to the etch stop layer 1401 over the fins, for example by chemical mechanical polishing (CMP). Oxide 1501 may be deposited by flow-controlled vertical deposition or by high density plasma (HDP). Adverting to FIG. 16, oxide 1301 may be recessed 35 nm to 50 nm to reveal the fins, or rather to a height of 10 nm above the etch stop layer between the fins.

Figure 17A:
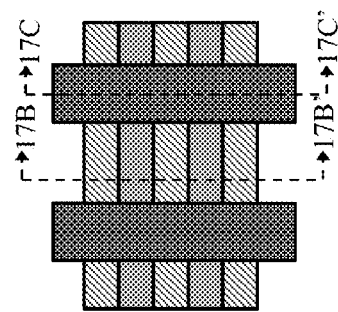
Figure 17B:
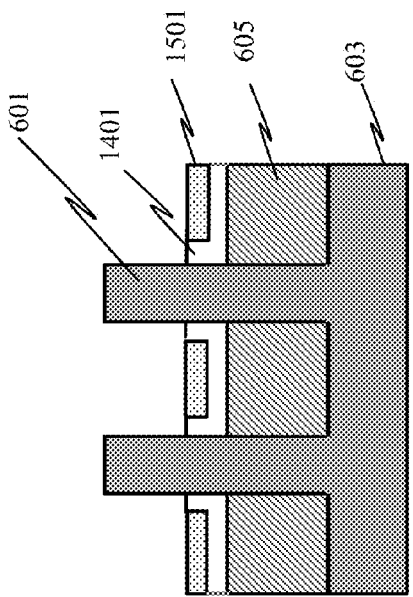
Figure 17C:
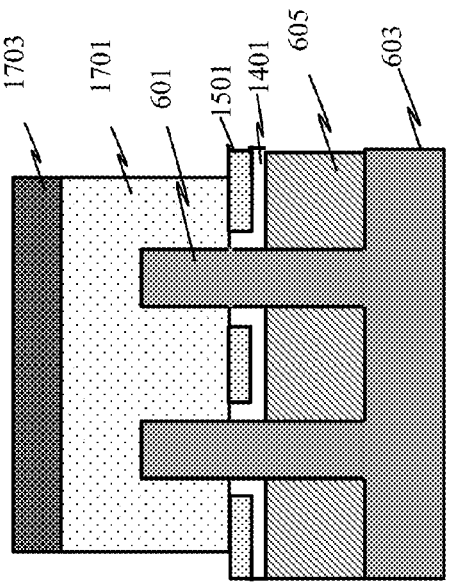

Etch stop layer 1401 may then be removed down to the upper surface of oxide 1501, as illustrated in FIGS. 17B and 17C. Etch stop layer 1401 may, for example, be etched by RIE or by a wet etch with high selectivity to the silicon of fins 601. In addition, a dummy gate material such as polysilicon and a hardmask material may be deposited and cut, for example by RIE, to form a dummy gate 1701 covered by a hardmask 1703.

Figure 18A:
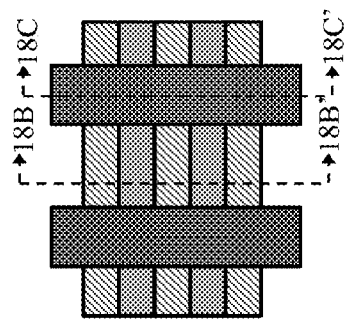
Figure 18B:
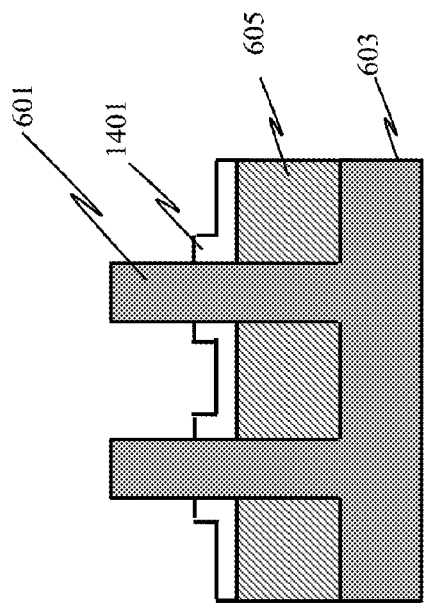
Figure 18C:
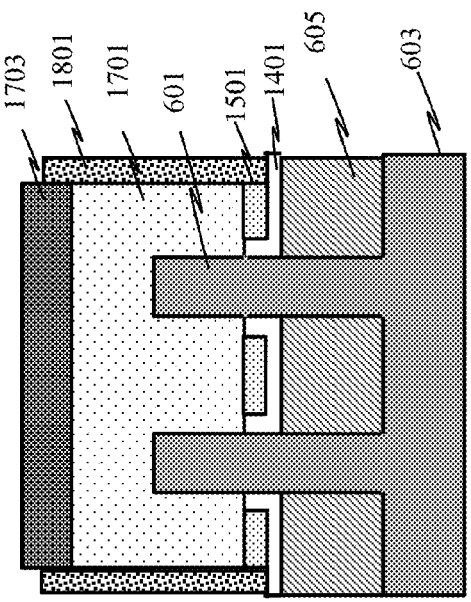

Adverting to FIGS. 18B and 18C, oxide 1501 may be removed from all exposed areas by a dHF cleaning step. As illustrated in FIG. 18C, field oxide 605 remains intact as it is protected from both the gate cut and the dHF clean by etch stop layer 1401. As further illustrated in FIG. 18C, gate spacers 1801 may be formed on opposite sides of dummy gate 1701 with a low-k dielectric material (wherein low-k is defined as having a dielectric constant less than 3.9).

Figure 19A:
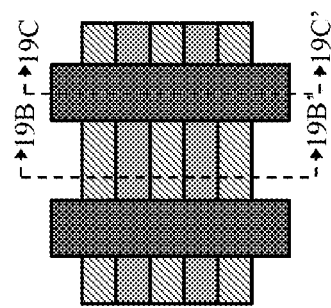
Figure 19B:
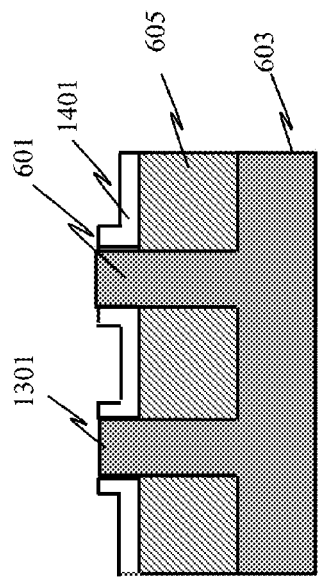
Figure 19C:
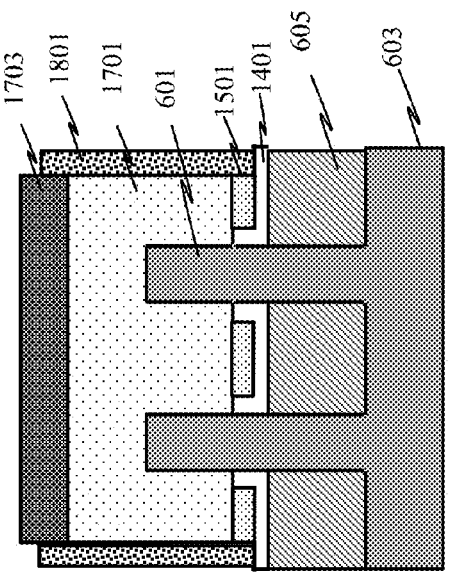

As illustrated in FIG. 19B, fins 601 may be recessed down to an upper surface of the etch stop layer 1401. Next, a pre-epi clean is performed, for example with dHF or SiCoNi. Adverting to FIGS. 20 and 21, source/drain regions 2001 or 2101, respectively, may then be epitaxially grown on fins 601 in the cavities formed by recessing in FIG. 19B. Source/drain regions 2001 may be formed of eSiP for NFET source/drain regions or eSiGe for PFET source/drain regions. FIG. 20 shows a standard fin pitch, whereas FIG. 21 shows a large fin pitch. As illustrated in FIGS. 20 and 21, a uniform epitaxial profile may be achieved with uniform fin sidewall spacers, independent of fin pitch. FIG. 22 schematically illustrates gate electrodes tip-to-tip with no field oxide loss between the gate electrodes, as the field oxide loss is self-stopping and independent of fin pitch. After the source/drain regions are grown, conventional RMG processes continue with removal of the dummy gate 1701 and replacement with a metal gate.

The embodiments of the present disclosure can achieve several technical effects including uniform epi profiles, uniform fin sidewall spacers, and reduced field oxide loss which is independent of fin pitch, which in turn reduces gate-to-contact shorts and short channel effects. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated FinFET semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming silicon fins separated by a field oxide on a silicon substrate;
    recessing the field oxide to reveal an upper portion of the silicon fins;
    forming a spacer layer conformally over the upper portion of the fins and over the field oxide;
    filling spaces between the fins with a material having high selectivity with the spacer layer;
    recessing the material;
    removing the spacer layer above an upper surface of the material;
    removing the material;
    recessing the upper portion of the fins; and
    epitaxially growing source/drain regions on the recessed fins.

2. The method according to claim 1, wherein the spacer layer comprises silicon nitride (SiN), silicon carbon nitride (SiCN), silicon oxycarbon nitride (SiOCN), or silicon boron carbon nitride (SiBCN).

3. The method according to claim 2, comprising forming the spacer layer to a thickness of 8 nm to 15 nm.

4. The method according to claim 1, comprising recessing the material down to a thickness of 150 nm to 300 nm.

5. The method according to claim 1, wherein the spacer layer comprises an etch stop layer.

6. The method according to claim 5, wherein the etch stop layer comprises SiCN or hafnium oxide ($HfO_2$).

7. The method according to claim 6, comprising forming the etch stop layer to a thickness of 2 nm to 6 nm.

8. The method according to claim 1, comprising forming the spacer layer by forming a self-aligned contact oxide layer followed by an etch stop layer.

9. The method according to claim 1, comprising filling the spaces with the material by flow controlled vertical deposition (FCVD) or high density plasma (HDP) followed by chemical mechanical polishing (CMP).

10. The method according to claim 1, comprising recessing the material to a depth of 35 nm to 50 nm.

11. The method according to claim 1, comprising removing the spacer layer above an upper surface of the material by reactive ion etching (RIE) or wet etching.

12. The method according to claim 1, comprising prior to removing the material:
    forming dummy gate electrodes over the fins;
    forming a hardmask over the dummy electrodes; and
    forming low-k dielectric spacers on sidewalls of the dummy gate electrodes.

13. A method comprising:
    forming silicon fins separated by a field oxide on a silicon substrate;
    recessing the field oxide to reveal an upper portion of the silicon fins;
    forming a spacer layer of silicon nitride (SiN), silicon carbon nitride (SiCN), silicon oxycarbon nitride (SiOCN), or silicon boron carbon nitride (SiBCN) to a thickness of 8 nm to 15 nm or of SiCN or hafnium oxide ($HfO_2$) to a thickness of 2 nm to 6 nm conformally over the upper portion of the fins and over the field oxide;
    filling spaces between the fins with an oxide having high selectivity with the spacer layer;
    recessing the oxide to a thickness of 5 nm to 20 nm;
    removing the spacer layer above an upper surface of the oxide;
    removing the oxide;
    recessing the upper portion of the fins; and
    epitaxially growing source/drain regions on the recessed fins.

\* \* \* \* \*